(12) United States Patent
Hsu et al.

(10) Patent No.: US 9,315,918 B2
(45) Date of Patent: Apr. 19, 2016

(54) CRYSTALLINE SILICON INGOT AND METHOD OF FABRICATING THE SAME

(75) Inventors: Sung-Lin Hsu, Hsinchu (TW); Cheng-Jui Yang, Hsinchu (TW); Pei-Kai Huang, Hsinchu (TW); Sheng-Hua Ni, Hsinchu (TW); Yu-Min Yang, Hsinchu (TW); Ming-Kung Hsiao, Hsinchu (TW); Wen-Huai Yu, Hsinchu (TW); Ching-Shan Lin, Hsinchu (TW); Wen-Ching Hsu, Hsinchu (TW); Chung-Wen Lan, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 15 days.

(21) Appl. No.: 13/416,765

(22) Filed: Mar. 9, 2012

(65) Prior Publication Data

US 2013/0095027 A1 Apr. 18, 2013

(30) Foreign Application Priority Data

Oct. 14, 2011 (TW) .............................. 100137420 A

(51) Int. Cl.
*C01B 33/02* (2006.01)
*C30B 9/00* (2006.01)
*C30B 11/00* (2006.01)
*C30B 28/06* (2006.01)
*C30B 29/06* (2006.01)

(52) U.S. Cl.
CPC .............. *C30B 11/006* (2013.01); *C30B 28/06* (2013.01); *C30B 29/06* (2013.01); *C01B 33/02* (2013.01); *C30B 9/00* (2013.01)

(58) Field of Classification Search
CPC ........ C01B 33/02; C30B 11/00; C30B 11/001
USPC ............................................ 423/348; 117/74
See application file for complete search history.

(56) References Cited

U.S. PATENT DOCUMENTS

| | | | |
|---|---|---|---|
| 3,562,023 A * | 2/1971 | Courier ......................... | 428/341 |
| 2006/0110609 A1* | 5/2006 | Eaton et al. ................... | 428/446 |
| 2011/0002835 A1* | 1/2011 | Kimbel ......................... | 423/348 |
| 2011/0177284 A1* | 7/2011 | Phillips et al. ................. | 428/98 |

OTHER PUBLICATIONS

K. Fujiwara, Directional growth method to obtain high quality polycrystalline silicon from the melt, May 26, 2006, Journal of Crystal Growth, 292, 282-285.*
T.Y. Wang, Grain control using spot cooling in multi-crystalline silicon crystal growth, May 22, 2009, Journal of Crystal Growth, 311, 263-267.*

* cited by examiner

*Primary Examiner* — Matthew E Hoban
*Assistant Examiner* — James Fiorito
(74) *Attorney, Agent, or Firm* — Osha Liang LLP

(57) ABSTRACT

A crystalline silicon ingot and a method of fabricating the same are disclosed. The crystalline silicon ingot of the invention includes multiple silicon crystal grains growing in a vertical direction of the crystalline silicon ingot. The crystalline silicon ingot has a bottom with a silicon crystal grain having a first average crystal grain size of less than about 12 mm. The crystalline silicon ingot has an upper portion, which is about 250 mm away from said bottom, with a silicon crystal grain having a second average crystal grain size of greater than about 14 mm.

8 Claims, 11 Drawing Sheets

CRYSTALLINE SILICON INGOT AND METHOD OF FABRICATING THE SAME

CROSS-REFERENCE TO RELATED APPLICATION

This utility application claims priority to Taiwan application serial number 100137420, filed Oct. 14, 2011, which is incorporated herein by reference.

BACKGROUND OF THE DISCLOSURE

1. Field of the Disclosure

The invention relates to a crystalline silicon ingot and a method of fabricating the same, and more particularly, to a crystalline silicon ingot containing small-sized silicon crystal grains at a bottom thereof and large-sized silicon crystal grains at a top thereof and a method of fabricating the same. The background of the disclosure can refer to the following references:

[1] K. Fujiwara, W. Pan, K. Sawada, M. Tokairin, N. Usami, Y. Nose, A. Nomura, T. Shishida, K. Nakajima, Directional growth method to obtain high quality polycrystalline silicon from its melt, Journal of Crystal Growth 2006; 292: 282-285; and

[2] T. Y. Wang, S. L. Hsu, C. C. Fei, K. M. Yei, W. C. Hsu, C. W. Lan, Grain control using spot cooling in multi-crystalline silicon crystal growth, Journal of Crystal Growth 2009; 311:263-267.

2. Brief Description of the Related Art

Crystal growth by casting polycrystalline silicon in a laboratory grade can attain the growth of facet dendrite in a bottom of a crucible. For example, the above-mentioned reference [1] proposes crystal growth in a lateral direction densely spreads on a bottom of a crucible by local undercooling, and then post-shaped structures grow upwards. Large-sized silicon crystal grains thereof have low defect density and a better dual crystal structure, sigma 3. Accordingly, made from a silicon wafer sliced from the crystalline silicon ingot produced in accordance with reference [1], solar cells can achieve higher photo-electron conversion efficiency.

However, in the extent of a scale for an industry grade, it is relatively difficult to have facet dendrite densely spread on a bottom of a crucible by local undercooling. Industry-grade polycrystalline silicon cast, affected by the crucible and the uniformity of heating the entirety, is performed with the increase of variances of controlling the initial undercooling degree. It results in the fact that the polycrystalline silicon grows with large-sized crystal grains and without any better dual crystal structure in the bottom of the crucible, so as to become a portion with higher defect density. The defect density dramatically increases during crystal growth such that the crystalline silicon ingot has a poor crystal quality and subsequently-formed solar cells have lower photo-electron conversion efficiency.

SUMMARY OF THE DISCLOSURE

The present invention is directed to a crystalline silicon ingot and a method of fabricating the same. The crystalline silicon ingot is formed with reduction of an increasing rate of defects, and thus the crystalline silicon ingot has a better crystal quality. Also, subsequently-formed solar cells have higher photo-electron conversion efficiency.

In one embodiment for fabricating a crystalline silicon ingot, a silicon melt can be first formed in a crucible that itself is defined with a vertical direction. Next, at least one thermal control parameter of the silicon melt is controlled such that multiple silicon crystal grains in the silicon melt nucleate on an inner wall of a bottom of the crucible and grow in the vertical direction. Finally, the thermal control parameter continues to be controlled until the entirety of the silicon melt solidifies to become a crystalline silicon ingot.

With regards to the present invention, the crystalline silicon ingot has a bottom with a silicon crystal grain having a first average crystal grain size of less than about 12 mm. The crystalline silicon ingot has an upper portion, 250 mm away from the bottom thereof, with a silicon crystal grain having a second average crystal grain size of greater than about 14 mm. In another embodiment, the silicon crystal grain at the bottom of the crystalline silicon ingot has the first average crystal grain size of preferably less than about 8 mm.

With regards to the invention, the silicon crystal grain at the upper portion of the crystalline silicon ingot has a defect density less than 20% in term of defect area ratio.

In one embodiment, the inner wall of the bottom of the crucible has a roughness ranging from 300 micrometers to 1000 micrometers such that the inner wall of the bottom provides multiple nucleation sites for silicon crystal grains.

In one embodiment, a heater is mounted on the crucible, and a directional solidification block is mounted under the crucible. The thermal control parameter may contain a first temperature gradient from the heater to the crucible, a second temperature gradient from a bottom of the silicon melt to a top of the directional solidification block or a heat flux.

Different from the prior art, the present invention proposes a spreading ratio of large-sized silicon crystal grains can be dramatically reduced by controlling the thermal control parameter and the nucleation sites densely spreading on the bottom of the crucible. Small-sized silicon crystal grains result in less competition of crystal growth and spread densely so as to be subject to growing upwards in a single direction. This reduces the phenomenon that large-sized crystal grains absorb small-sized ones and avoids the defect that post-shaped crystal grains can not grow completely. Besides, a grain boundary of crystal grains densely spreading provides a path for movement due to in-crystal dislocation or other stress defects. This reduces a rate of increasing defects and improves a crystal quality of the crystalline silicon ingot, as a whole. Subsequently-formed solar cells provide better photo-electron conversion efficiency.

The accompanying drawings are included to provide a further understanding of the invention, and are incorporated as a part of this specification. The drawings illustrate embodiments of the invention and, together with the description, serve to explain the principles of the invention.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure.

Figure 1A:
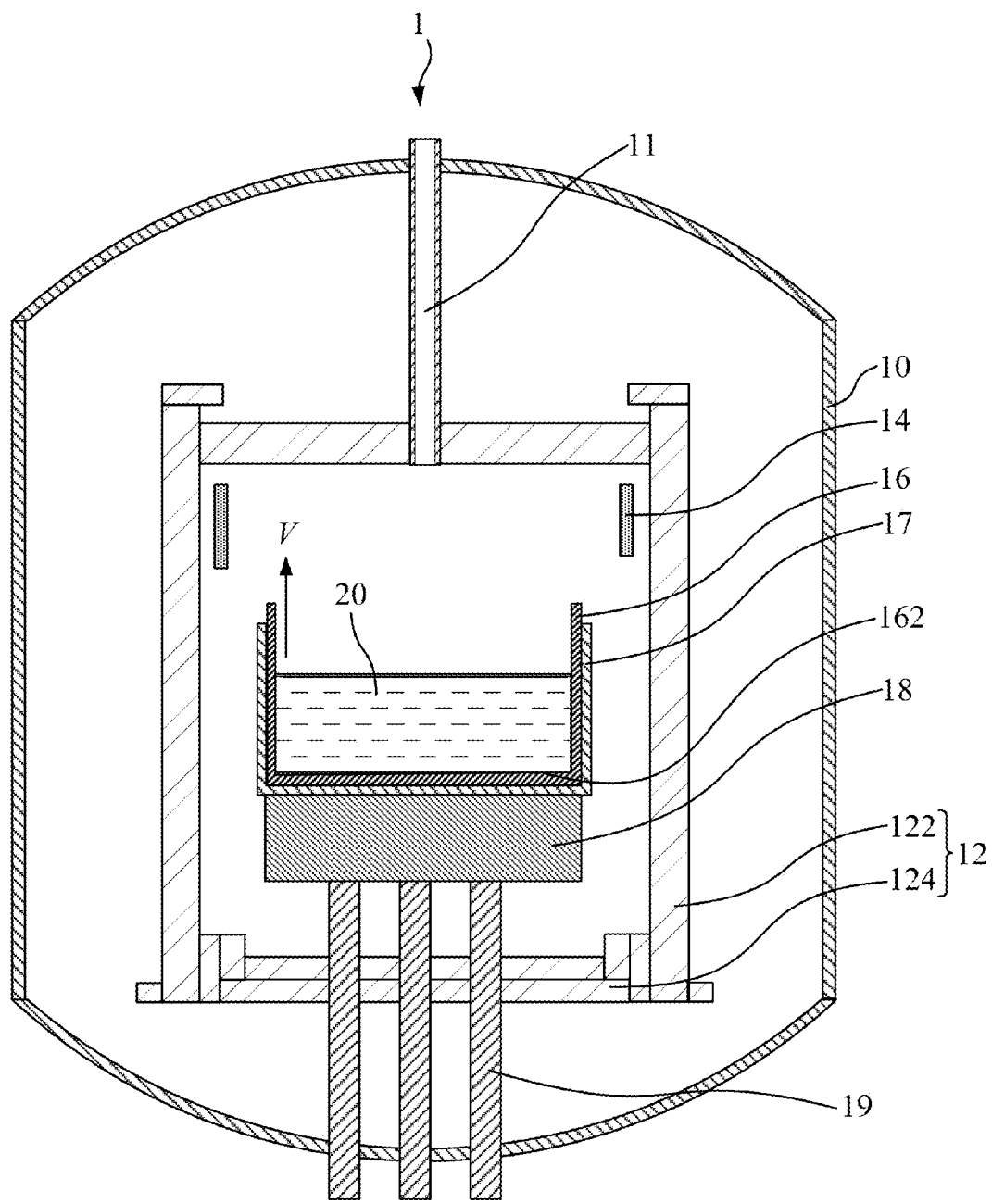
FIGS. 1A and 1B illustrate a method for fabricating a crystalline silicon ingot in accordance with an embodiment of the present invention.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

The present provides a method for fabricating a crystalline silicon ingot with a significantly reduced spreading ratio of large-sized silicon crystal grains by controlling a thermal control parameter, nucleation sites densely spread on a bottom of a crucible and so on. Besides, as a whole, the crystalline silicon ingot has a better crystal quality and subsequently-formed solar cells provide better photo-electron conversion efficiency.

Figure 1B:
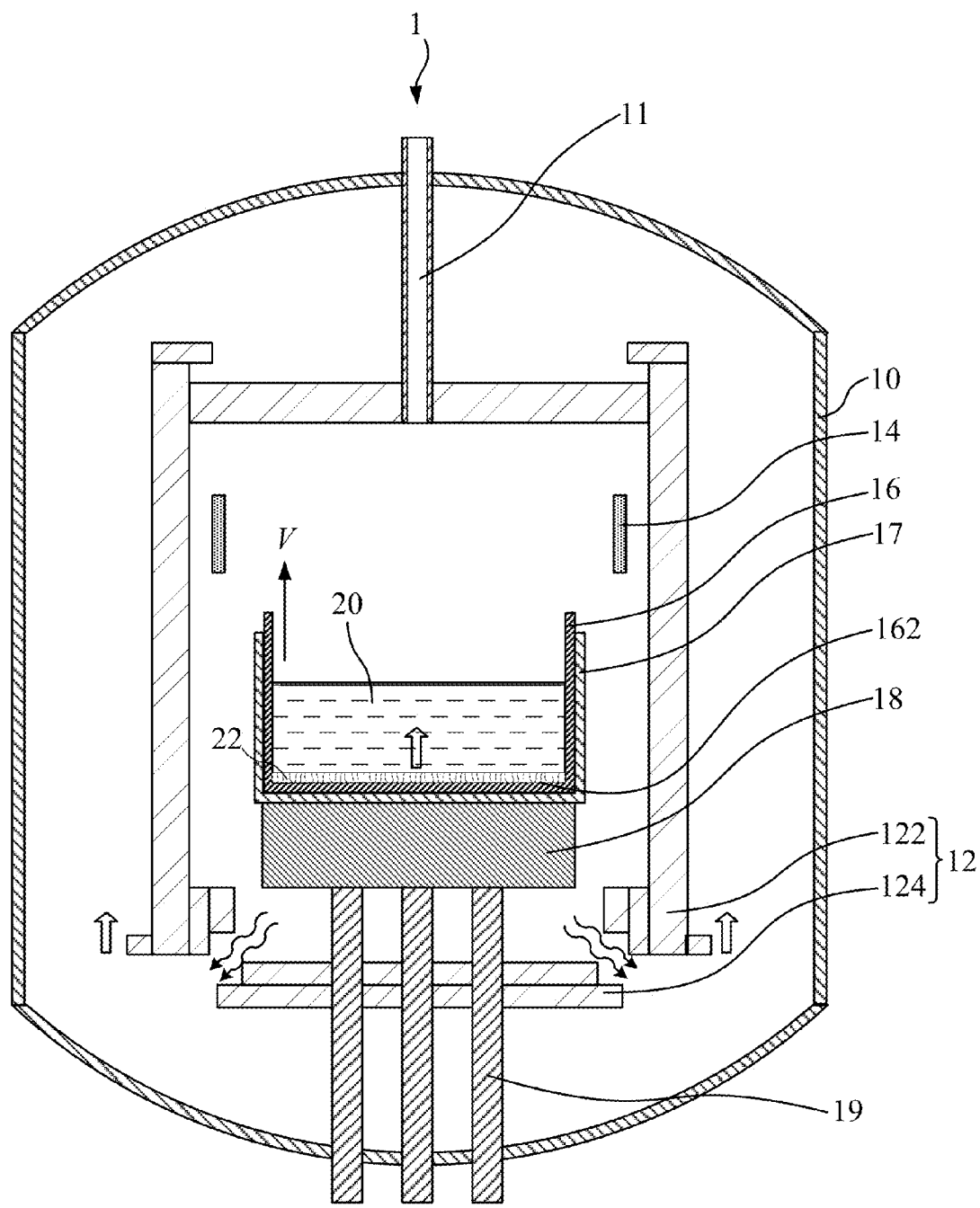

FIGS. 1A and 1B are cross-sectional views illustrating a method for fabricating a crystalline silicon ingot in accordance with an embodiment of the present invention.

As shown in FIG. 1A, the method of the present invention is typically based on a directional solidification system (DSS) containing a DSS crystal growth furnace 1. The DSS crystal growth furnace 1 includes a furnace body 10, a heat insulating cage 12 composed of a top heat insulating mask 122 and a bottom heat insulating plate 124, a directional solidification block 18 mounted in the heat insulating cage 12, at least one post 19 supporting the directional solidification block 18, a pedestal 17 mounted on the directional solidification block 18, a crucible 16 mounted in the pedestal 17, a heater mounted on the crucible 16 and an inert gas duct 11 passing through the furnace body 10 and the heat insulating cage 12.

In one embodiment, the crucible 16 can be a quartz crucible. The directional solidification block 18 can be made from graphite. The pedestal 17 can be made from graphite. The inert gas duct 11 can transmit an argon gas into the heat insulating cage 12.

With regards to the invention, a silicon melt 20 is formed in the crucible 16, as shown in FIG. 1. The crucible 16 has a vertical direction V.

Next, at least one thermal control parameter of the silicon melt 20 is controlled such that multiple silicon crystal grains 22 in the silicon melt 20 nucleate on an inner wall 162 of a bottom of the crucible 16 and grow in the vertical direction V, as shown in FIG. 1B. The thermal control parameter contains a heat flux. During crystal growth in the DSS crystal growth furnace 1, the top heat insulating mask 122 rises slowly such that a clearance is created to a space originally sealed by the heat insulating cage 12 and becomes a path for heat exchanging between an inside and outside of the heat insulating cage 12. This creates heat flux.

Finally, the thermal control parameter continues to be controlled until the entirety of the silicon melt 20 solidifies to become a crystalline silicon ingot.

In one embodiment, the inner wall 162 of the bottom of the crucible 16 has a roughness ranging from 300 micrometers to 1000 micrometers such that the inner wall 162 of the bottom provides multiple nucleation sites for silicon crystal grains.

In one embodiment, the method of forming the inner wall 162, of the bottom of the crucible 16, with the roughness ranging from 300 micrometers to 1000 micrometers can be performed by first forming multiple protrusions on the inner wall 162 of the bottom of the crucible 16, wherein the protrusions act as the nucleation sites and cause the inner wall 162, of the bottom of the crucible 16, with the roughness. Each of the protrusions can be made from a ceramic material or a green or sintered body of graphite.

In one embodiment, the protrusions can be a ceramic material, such as SiN, $Si_3N_4$, $SiO_2$, SiC, $Al_2O_3$ and/or AN, having a melting point higher than that of silicon. The method to form the protrusions can be performed by spray coating slurry, formed using a powder of graphite or the above-mentioned ceramic material, on the inner wall 162, of the bottom of the crucible 16. This can form an aggregate of the above-mentioned powder. Next, the aggregate of the powder can be calcined or sintered in a calcining or sintering temperature suitable for formation of a powder. Thereby, a green or sintered body of the protrusions can be formed.

Figure 2:
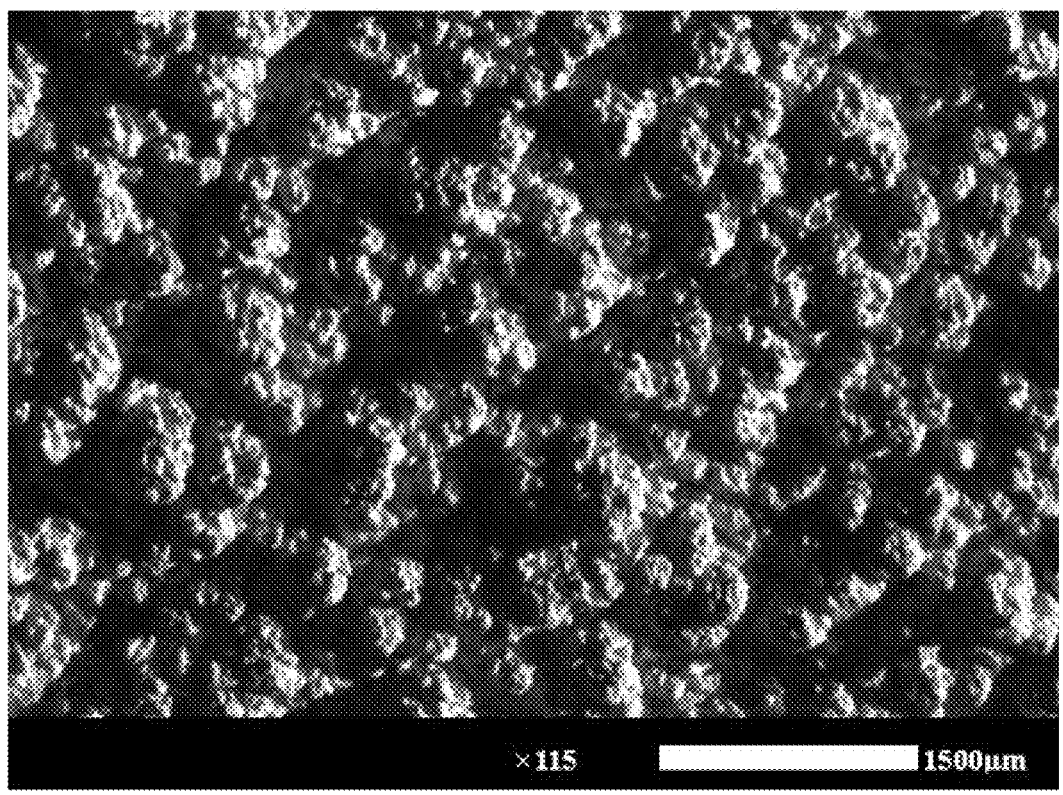
FIG. 2 illustrates a metallography of an inner wall of a bottom of a crucible, which shows multiple protrusions formed on the inner wall of the bottom thereof
Figure 3:
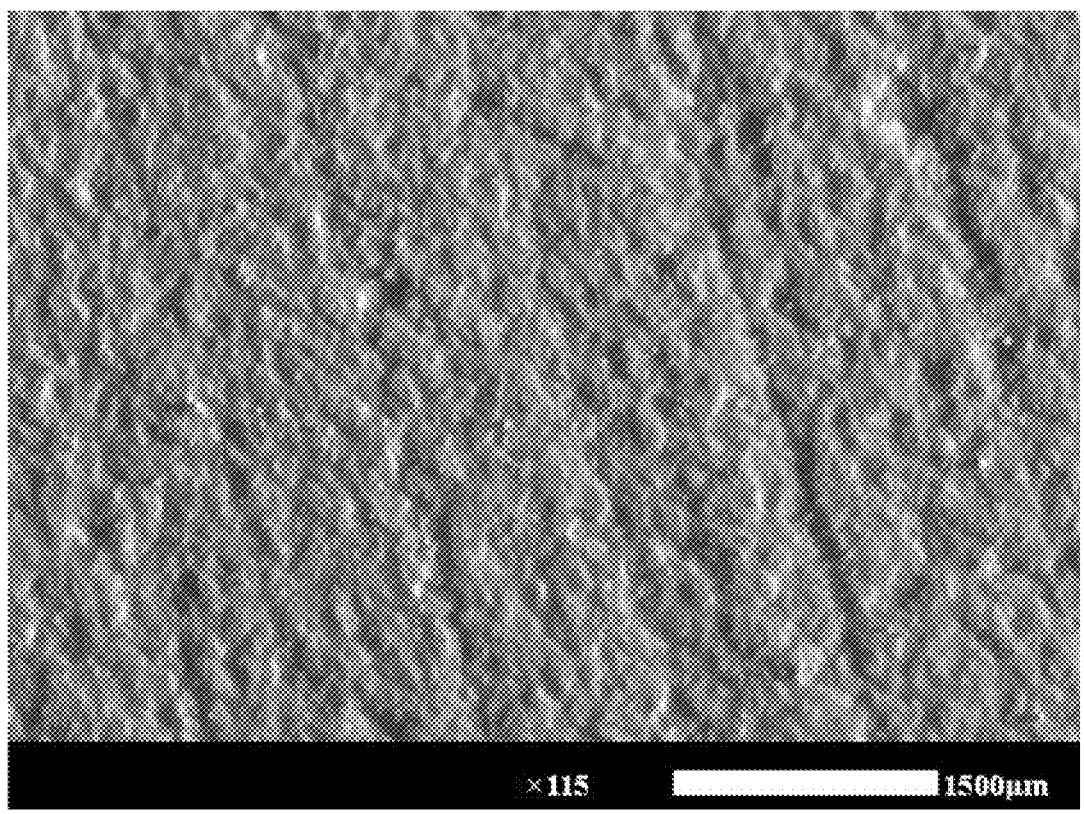
FIG. 3 illustrates a metallography of the inner wall of the bottom of the crucible before processed.

In one embodiment of the above-mentioned spray coating process, the spray coating pressure may range from 40 psi to 60 psi; the slurry pressure may range from 15 psi to 30 psi; the spray coating temperature may range from 40 degrees Celsius to 60 degrees Celsius. FIG. 2 illustrates a metallographic image of the inner wall 162 of the bottom of the crucible 16 calcined in accordance with the above-mentioned embodiment. For comparison, FIG. 3 illustrates a metallography of the inner wall 162 of the bottom of the crucible 16 before spray coated. Referring to FIG. 3, the inner wall 162 of the bottom of the crucible 16 not processed by the above-mentioned spray coating process has a roughness between 50 micrometers and 100 micrometers. Referring to FIG. 2, the inner wall 162 of the bottom of the crucible 16 after the above-mentioned spray coating and calcining processes has a roughness between 300 micrometers and 500 micrometers.

Alternatively, the inner wall 162 of the bottom of the crucible 16 can be treated using a sand blasting process, and thereby the inner wall 162 of the bottom of the crucible 16 has a roughness between 300 micrometers and 1000 micrometers.

Referring to FIGS. 1A and 1B, the heater 14 is mounted on the crucible 16. The directional solidification block 18 is mounted under the crucible 16 and indirectly contacts the crucible 16. The thermal control parameter may contain a first temperature gradient from the heater 14 to the crucible 16, a second temperature gradient from a bottom of the silicon melt 20 to a top of the directional solidification block 18 or a heat flux. In one embodiment, the first temperature gradient is necessarily controlled under 0.4° C./cm by enlarging a distance between the heater 14 and the crucible 16 or by controlling a heating temperature of the heater 14 under 1410 degrees Celsius. The second temperature gradient is necessarily controlled under 17° C./cm by enlarging a thickness of the directional solidification block 18. The heat flux is necessarily controlled over 3700 W/m$^2$ by accelerating the opening of the top heat insulating mask 122 up to 3 cm/hr. The purpose of controlling the second temperature gradient and the heat flux is to increase undercooling at the bottom of the crucible 16.

Different from the prior art, the crystalline silicon ingot has a bottom with a silicon crystal grain having a first average crystal grain size of less than about 12 mm. In one embodiment, the crystalline silicon ingot has an upper portion, 250 mm away from the bottom thereof, with a silicon crystal grain having a second average crystal grain size of greater than about 14 mm. In another embodiment, the silicon crystal grain at the bottom of the crystalline silicon ingot has the first average crystal grain size of preferably less than about 8 mm.

In one embodiment, the silicon crystal grain at the upper portion of the crystalline silicon ingot has a defect density less than 20% in term of defect area ratio.

Figure 4:
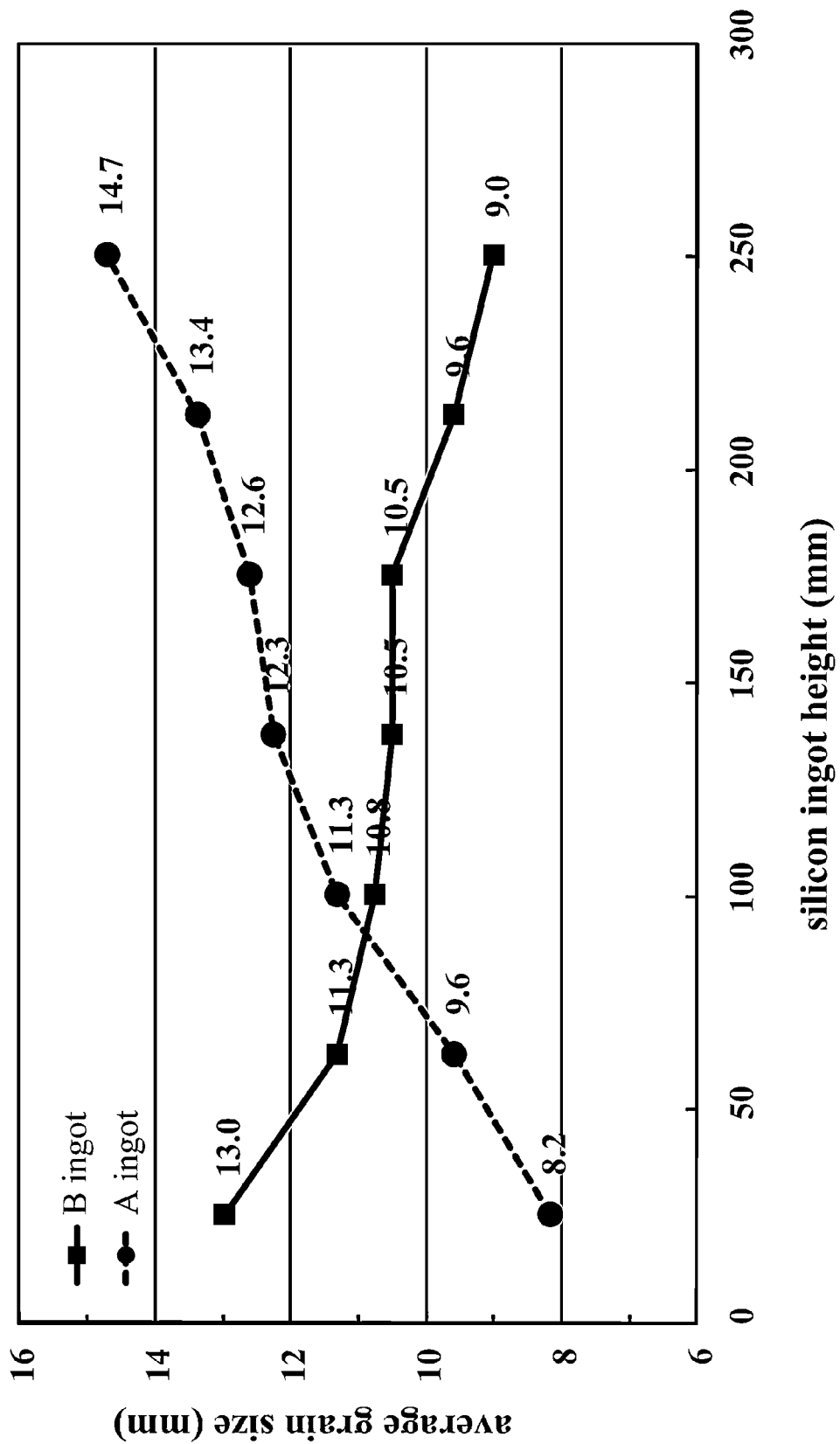
FIG. 4 illustrates a result of comparing silicon crystal grain sizes of a crystalline silicon ingot of an embodiment of the present invention and those of a compared crystalline silicon ingot.

FIG. 4 illustrates average crystal grain sizes with changes in heights of the crystalline silicon ingot A of the present invention and those with changes in heights of the crystalline silicon ingot B, made in accordance with reference [1], for comparison.

Figure 5:
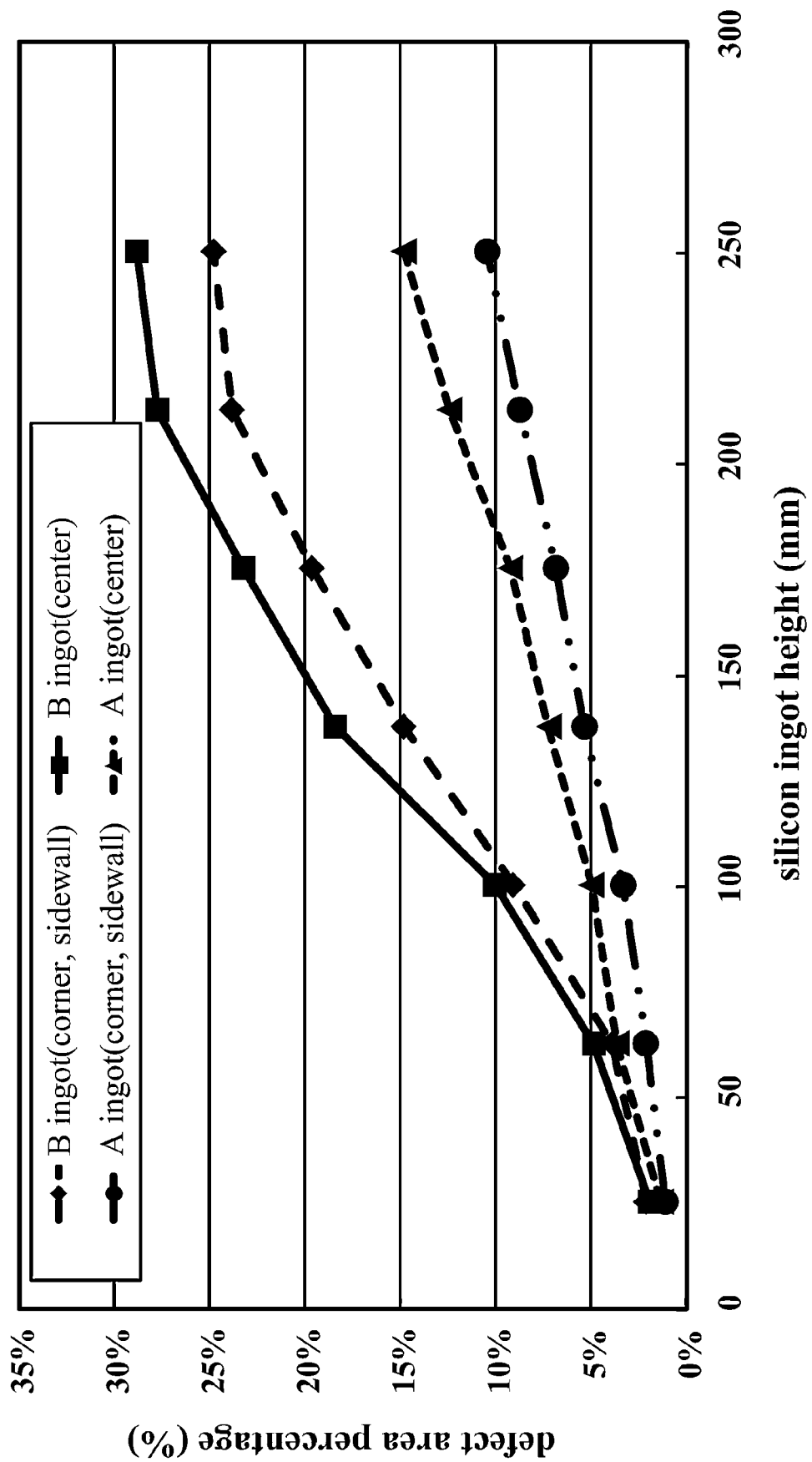
FIG. 5 illustrates a result of comparing defect densities of a crystalline silicon ingot of an embodiment of the present invention and those of a compared crystalline silicon ingot.

FIG. 5 illustrates defect densities with changes in heights of the crystalline silicon ingot A at corner, sidewall and center portions of the ingot A. The defect densities in FIG. 5 are defined by ratios of defect areas. For comparison, FIG. 5 also illustrates ratios of defect areas with changes in heights of the crystalline silicon ingot B at corner, sidewall and center portions of the ingot B.

Figure 6A:
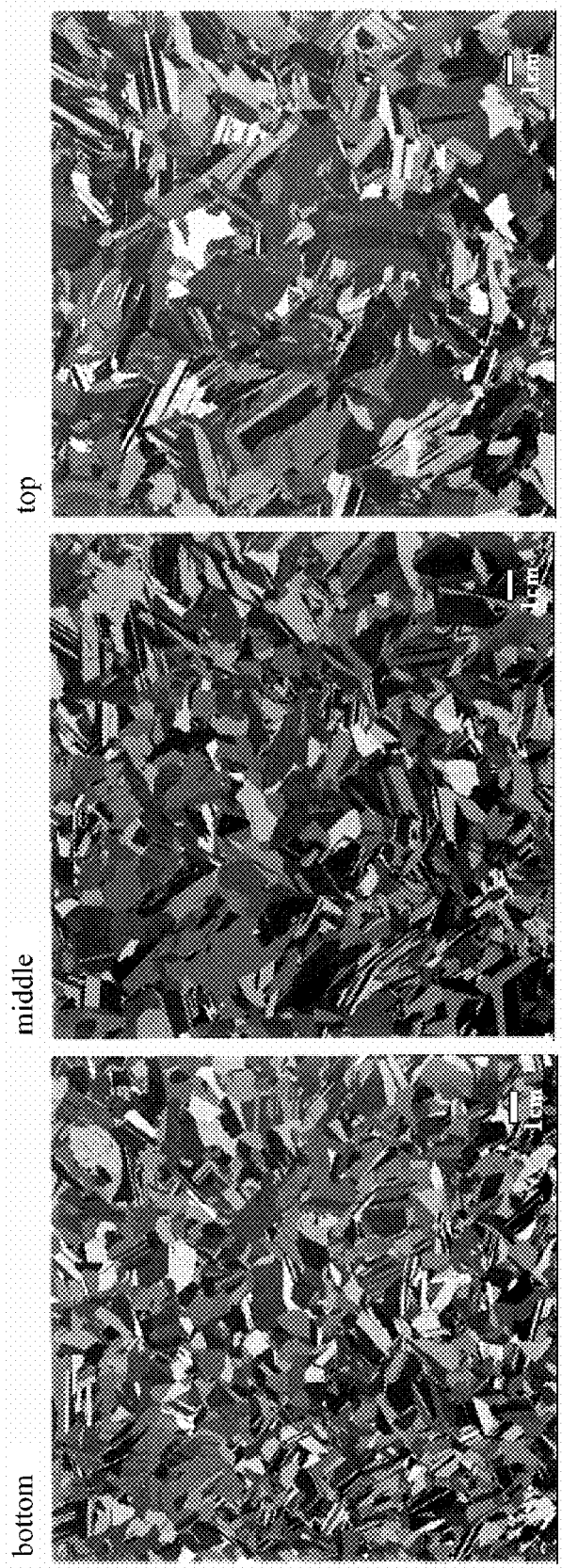
FIG. 6A illustrates metallographic images of silicon crystal grain sizes at a bottom, middle and top of a crystalline silicon ingot of an embodiment of the present invention.
Figure 6B:
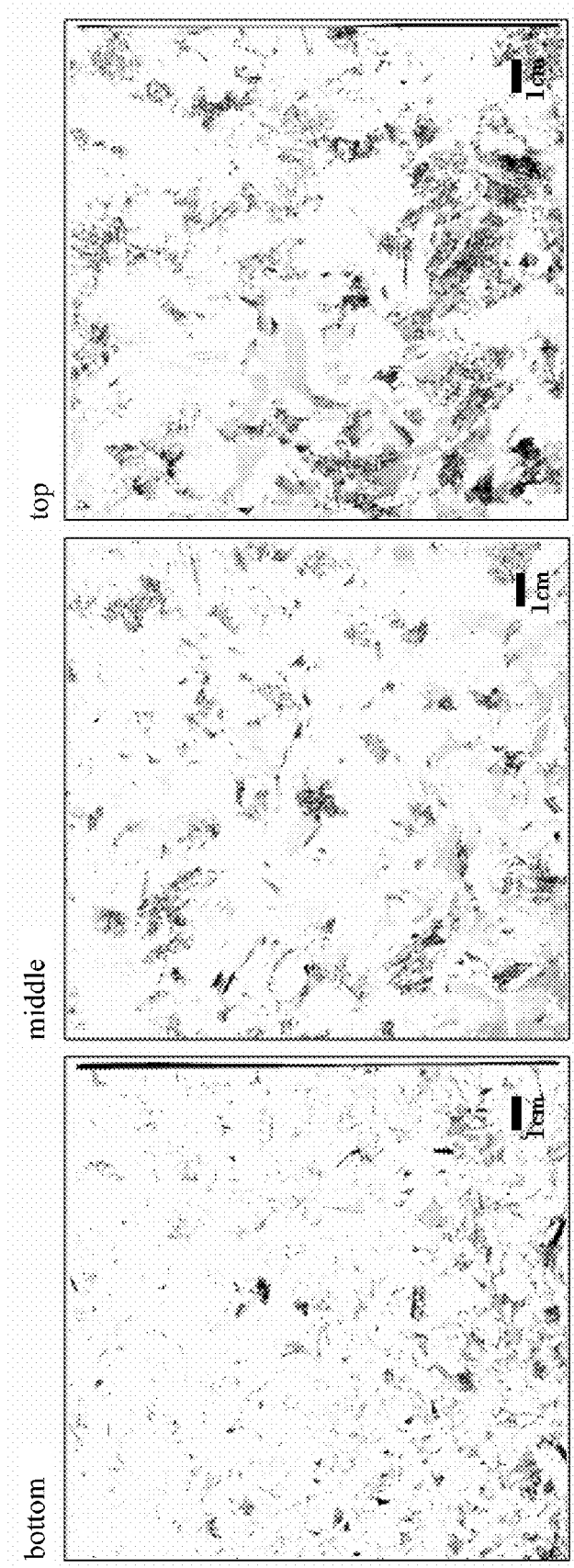
FIG. 6B illustrates metallographic images of defect densities at a bottom, middle and top of a crystalline silicon ingot of an embodiment of the present invention.
Figure 7A:
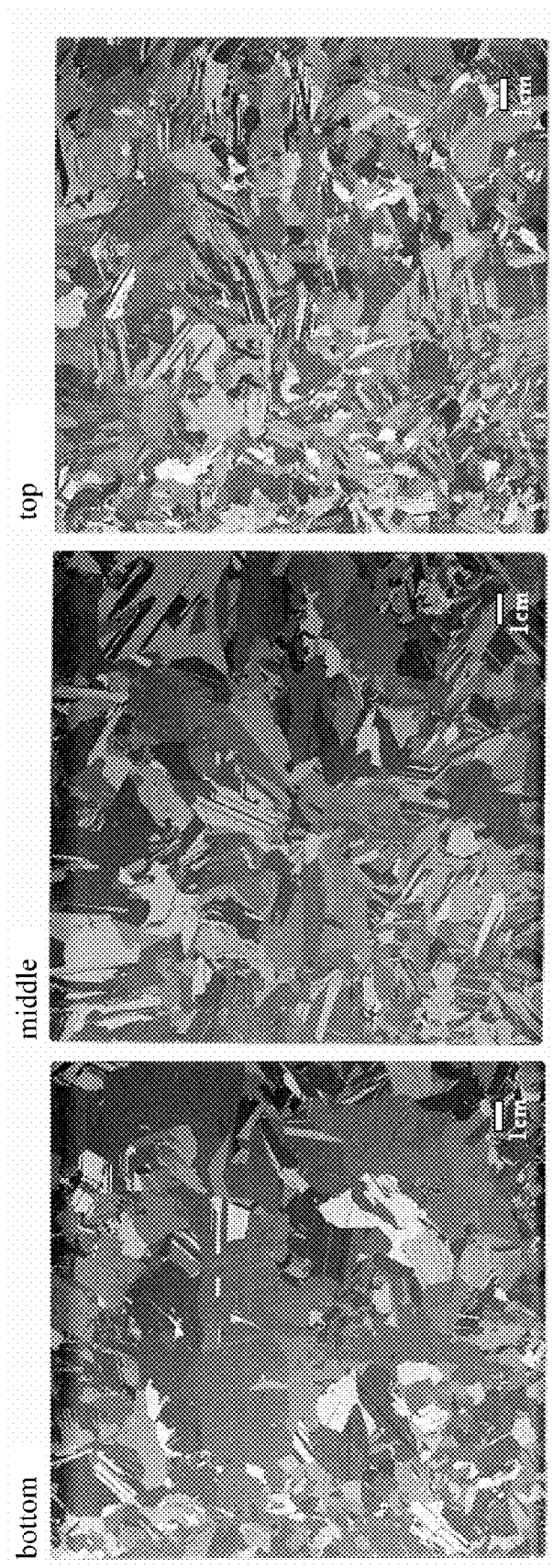
FIG. 7A illustrates metallographic images of silicon crystal grain sizes at a bottom, middle and top of a compared crystalline silicon ingot.
Figure 7B:
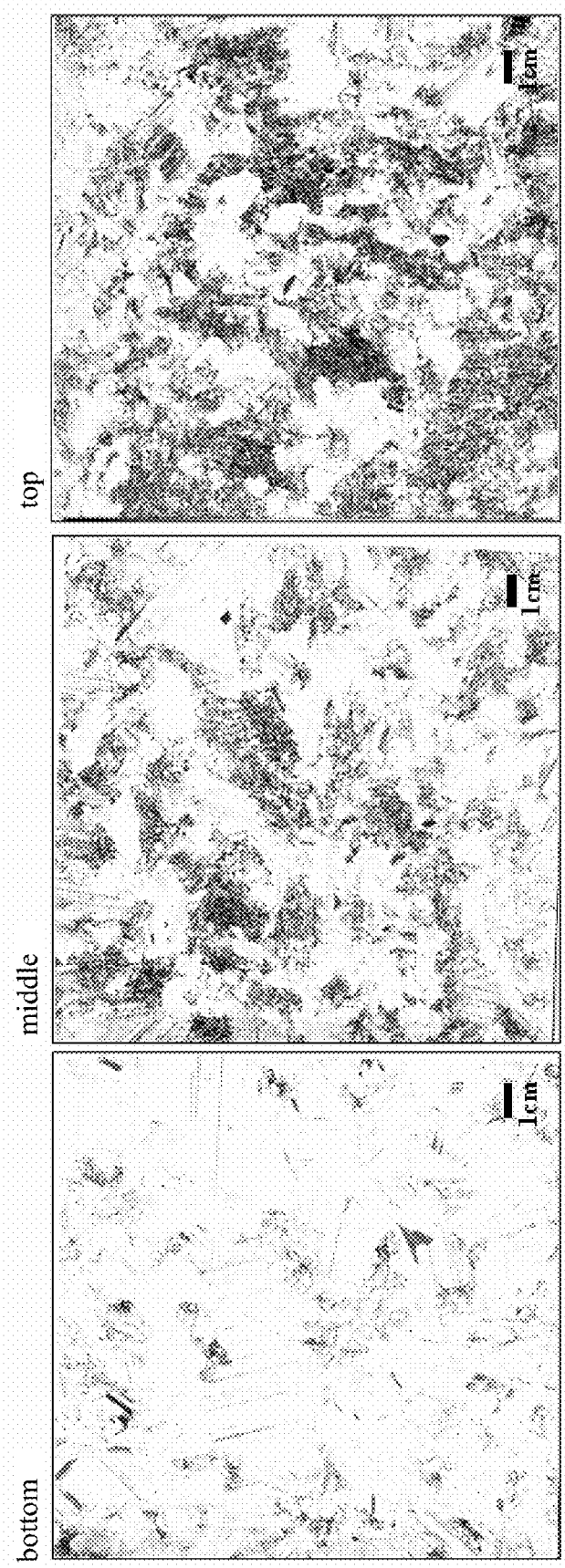
FIG. 7B illustrates metallographic images of defect densities at a bottom, middle and top of a compared crystalline silicon ingot.

FIG. 6A illustrates metallographic images of silicon crystal grain sizes at a bottom, middle and top (250 mm away from the bottom) of the crystalline silicon ingot A. FIG. 6B illustrates metallographic images of defect densities at the bottom, middle and top of the crystalline silicon ingot A. For comparison, FIG. 7A illustrates metallographic images of silicon crystal grain sizes at a bottom, middle and top (250 mm away from the bottom) of the crystalline silicon ingot B. FIG. 7B illustrates metallographic images of defect densities at the bottom, middle and top of the crystalline silicon ingot B.

Figure 8:
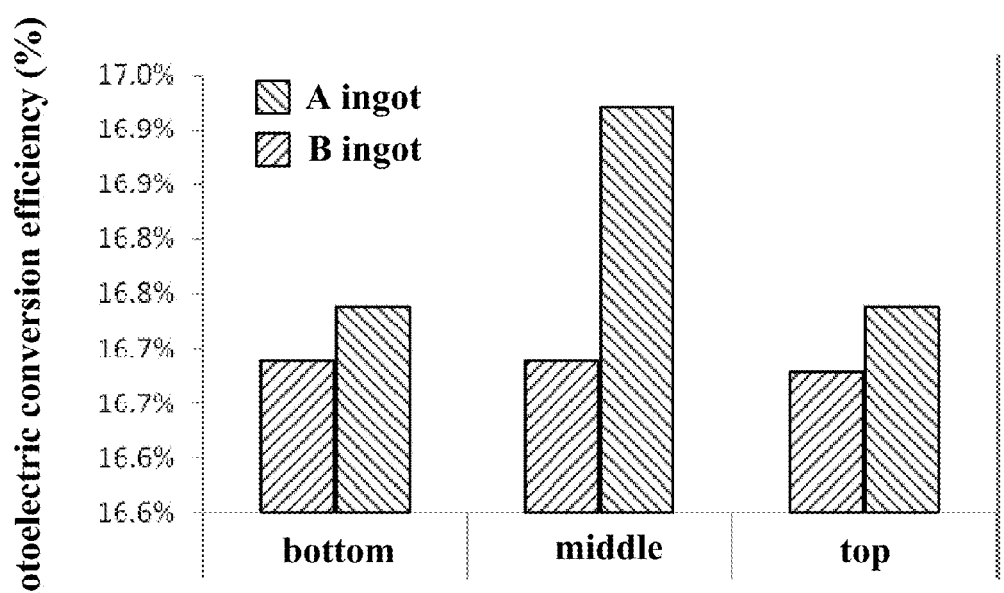
FIG. 8 illustrates a result of comparing average photo-electron conversion efficiencies of solar cells created from a crystalline silicon ingot of an embodiment of the present invention and those created from a compared crystalline silicon ingot.

FIG. 8 illustrates photo-electron conversion efficiencies of solar cells created from the bottom, middle and top (250 mm away from the bottom) of the crystalline silicon ingot A. For comparison, FIG. 8 also illustrates photo-electron conversion efficiencies of solar cells created from the bottom, middle and top (250 mm away from the bottom) of the crystalline silicon ingot B.

Referring to the data of FIGS. 4, 5 and 8 and the metallographic of FIGS. 6A, 6B, 7A and 7B, the crystal of the ingot B grows with large-sized crystal grains and without any better dual crystal structure in the bottom of the crucible, so as to become a portion with higher defect density. The defect density dramatically increases during crystal growth such that the crystalline silicon ingot has a poor crystal quality and subsequently-formed solar cells have lower photo-electron conversion efficiency. Comparing to the ingot B, the crystal growth of the ingot A is controlled by a thermal control parameter and nucleation sites densely spreading on the bottom of the crucible. This results in significantly reducing a spreading ratio of large-sized silicon crystal grains. Small-sized silicon crystal grains result in less competition of crystal growth and spread densely so as to be subject to growing upwards in a single direction. This reduces the phenomenon that large-sized crystal grains absorb small-sized ones and avoids the defect that post-shaped crystal grains can not grow completely. Besides, in the ingot A, a grain boundary of crystal grains densely spreading provides a path for movement due to in-crystal dislocation or other stress defects. This reduces a rate of increasing defects and improves a crystal quality of the crystalline silicon ingot, as a whole. Subsequently-formed solar cells provide better photo-electron conversion efficiency.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A method for fabricating a crystalline silicon ingot, comprising:

forming a silicon melt in a crucible defining a vertical direction;

controlling at least one thermal control parameter of said silicon melt such that multiple silicon crystal grains in said silicon melt nucleate on an inner wall of a bottom of said crucible and grow along said vertical direction; and controlling said at least one thermal control parameter continually until entirety of said silicon melt solidifies to become said crystalline silicon ingot, wherein said crystalline silicon ingot has a bottom with a silicon crystal grain having a first average crystal grain size of less than about 12 mm, wherein said inner wall of said bottom of said crucible has multiple protrusions performed by spraying coating slurry with a spray coating pressure from 40 psi to 60 psi and a spraying coating temperature from 40 degree Celsius to 60 degree Celsius, said protrusions having a roughness ranging from 300 micrometers to 1000 micrometers such that said inner wall of said bottom provides multiple nucleation sites for silicon crystal grains.

2. The method of claim 1, wherein said crystalline silicon ingot has an upper portion, which is about 250 mm away from said bottom, with a silicon crystal grain having a second average crystal grain size of greater than about 14 mm.

3. The method of claim 2, wherein said first average crystal grain size is less than about 8 mm.

4. The method of claim 2, wherein said silicon crystal grain at said upper portion of said crystalline silicon ingot has a defect density less than 20% in term of defect area ratio.

5. The method of claim 1, wherein each of said multiple protrusions is in form of a ceramic material or a green or sintered body of a graphite.

6. The method of claim 1, wherein said ceramic material is selected from a group consisting of SiN, $Si_3N_4$, $SiO_2$, SiC, $Al_2O_3$ or AlN.

7. The method of claim 1, wherein said inner wall of said bottom of said crucible is treated by a sand blasting process, and thereby said inner wall of said bottom of said crucible has said roughness.

8. The method of claim 2, wherein a heater is mounted on said crucible, and a directional solidification block is mounted under said crucible, said at least one thermal control parameter is selected from a group consisting of a first temperature gradient from said heater to said crucible, a second temperature gradient from a bottom of said silicon melt to a top of said directional solidification block and a heat flux.

* * * * *